73-632 SR

10/31/78 OR 4,122,725

United States Patent [19]

Thompson

[11] 4,122,725

[45] Oct. 31, 1978

[54] LENGTH MODE PIEZOELECTRIC ULTRASONIC TRANSDUCER FOR INSPECTION OF SOLID OBJECTS

[75] Inventor: Robert B. Thompson, Thousand Oaks, Calif.

[73] Assignee: The United States of America as represented by the Administrator of the National Aeronautics and Space Administration, Washington, D.C.

[21] Appl. No.: 696,679

[22] Filed: Jun. 16, 1976

[51] Int. Cl.[2] .......... H01L 41/10

[52] U.S. Cl. .......... 73/632; 73/641; 73/644; 310/326; 310/336

[58] Field of Search .......... 310/8.2, 8.3, 8.7, 9.1, 310/8.1, 322, 334, 336, 326; 340/8 R, 9, 10, 8 MM; 73/71.5 VS, 67.5 R, 67.5 H, 67.8 R, 632, 641, 644

[56] References Cited

U.S. PATENT DOCUMENTS

| | | | |
|---|---|---|---|
| 2,063,952 | 12/1936 | Steinberger | 340/9 |
| 2,416,337 | 2/1947 | Mason | 310/8.2 X |
| 2,473,971 | 6/1949 | Ross | 340/9 UX |
| 2,508,544 | 5/1950 | Shaper | 340/9 UX |
| 2,943,297 | 6/1960 | Steinberger et al. | 340/9 |
| 3,478,309 | 11/1969 | Massa, Jr. | 340/9 |
| 3,949,349 | 4/1976 | Massa et al. | 310/9.1 X |

*Primary Examiner*—Mark O. Budd
*Attorney, Agent, or Firm*—Carl O. McClenny; John R. Manning; Marvin F. Matthews

[57] ABSTRACT

The transducer is constructed from individual transducer elements arranged in an array and configured to exhibit a predominant, longitudinal mode transversely to the array. The elements are interconnected through thin flexible sheets. Each element is individually damped, and the transducer as a whole is electrically damped through resonance with the clamped capacitance and dissipation. Electrical control permits in-phase operation of all transducer elements or control with preselected phase differences.

1 Claim, 8 Drawing Figures

FIG. 1
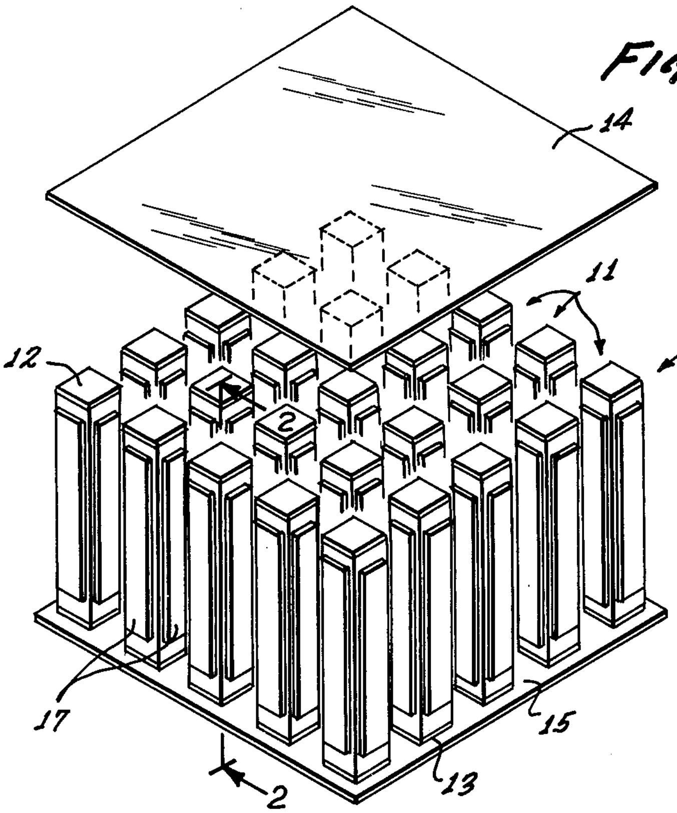
FIG. 2
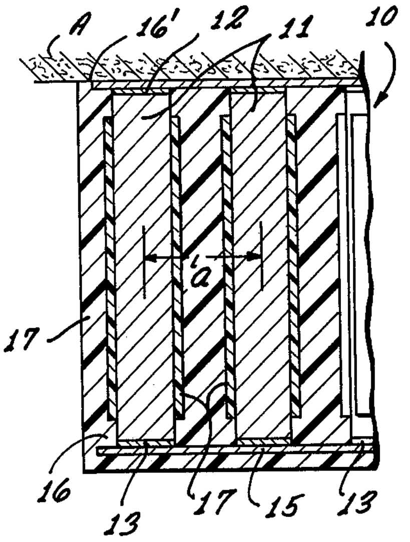
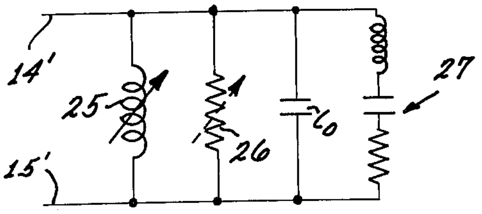
FIG. 4
FIG. 3
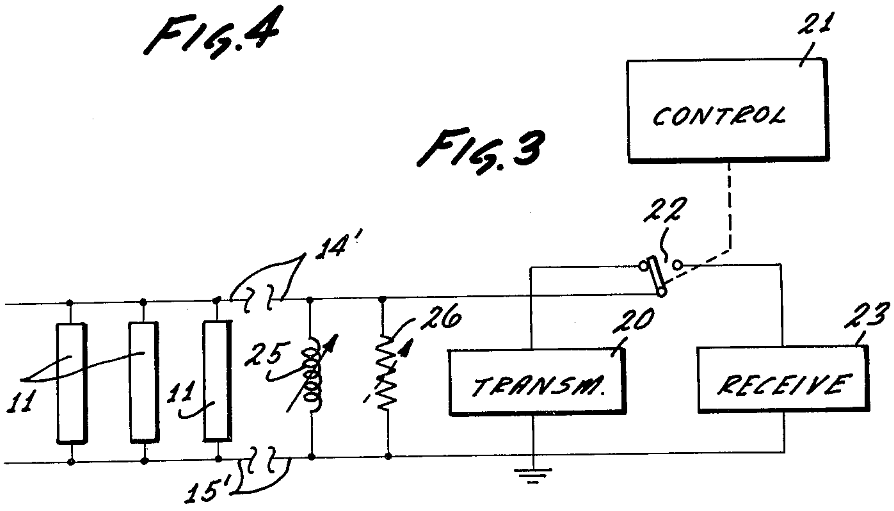

FIG. 5
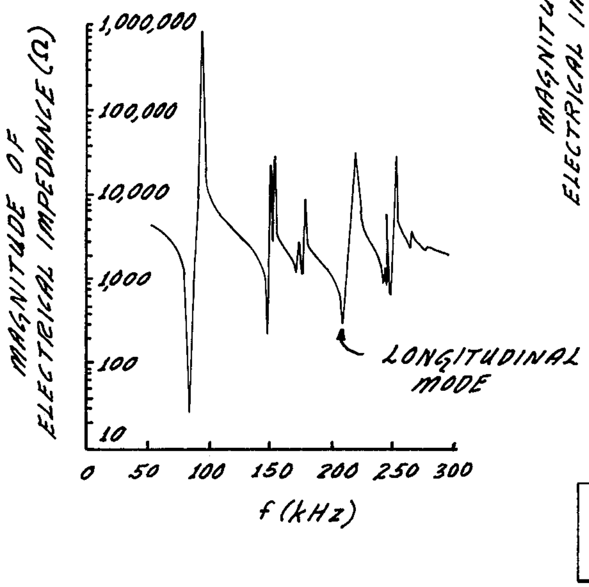
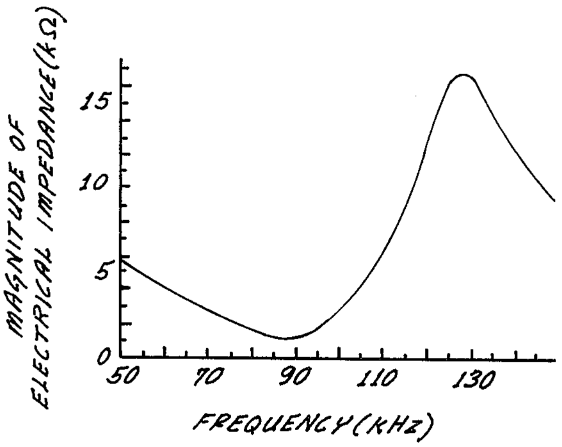
FIG. 6
FIG. 7
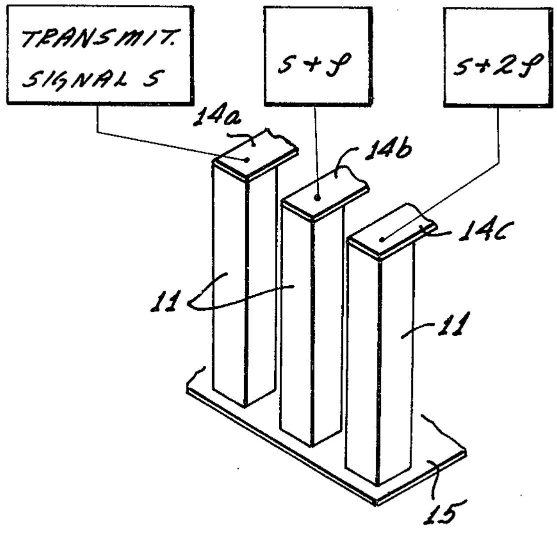
FIG. 8
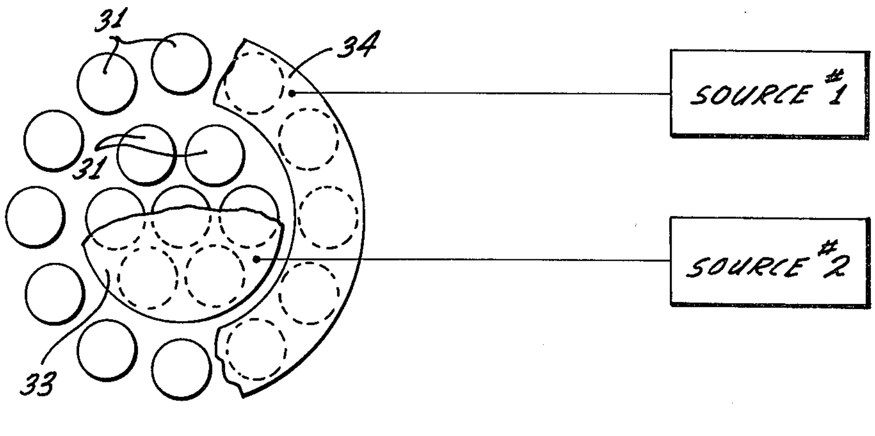

LENGTH MODE PIEZOELECTRIC ULTRASONIC TRANSDUCER FOR INSPECTION OF SOLID OBJECTS

BACKGROUND OF THE INVENTION

The present invention relates to ultrasonic transducers for inspecting materials having very low acoustic impedance, for example porous and fibrous materials.

The ultrasonic inspection of low acoustic impedance materials such as polyurethane foam or fibrous ceramics and others is a very difficult task for a variety of reasons. Ultrasonic inspection is usually carried out by means of piezoelectric transducers. The particular piezoelectric materials which are suitable for serving as active elements in ultrasonic transducers have an acoustic impedance which is much larger than the acoustic impedance of foam or of fibrous ceramic material. By way of example, lead-zirconate-titanate, a typical piezoelectric material, has an acoustic impedance which is almost 700 times the acoustic impedance of polyurethane foam, and about 500 times the acoustic impedance of fibrous silica ceramic. In other words, there is an inherent, significant mismatch in the acoustically active and generating material of the transducer on the one hand, and certain materials to be inspected on the other hand.

As such a transducer interfaces with low impedance material for purposes of transmitting thereto acoustic signals, most of the vibrations will be reflected back into the transducer, and very little energy will propagate into the material to be inspected. While a sufficiently strong inspection signal can be generated simply by driving the transducer with sufficient power, most of the electric energy applied to the transducer will remain therein and will be dissipated in some fashion. Accordingly, the transducer will ring so that short range echo signals returning to the transducer are readily obscured. Intensive damping of tranducers of available construction was found to be inadequate because it desensitizes the transducer for receiving echo signals to such an extent that only very strong echos can be detected.

The problem outlined above is compounded by the fact that transducers must be sufficiently broad banded for reasons of adequate resolution. Moreover, the transducers must have a sufficiently wide aperture to emit a relatively large wave front while capturing return echos over a sufficiently wide geometric range and area. It was found that conventional transducers vibrate in a variety of modes but only one mode, namely the mode oscillating in the direction normal to the interface with the object to be inspected, is of interest. Limiting the band width and/or providing for broad banded strong damping (to impede ringing) for eliminating the unwanted modes desensitizes, again, the transducer, and weaker echo signals will not be detected.

The problem is further compounded by the fact that porous and fibrous material attentuate high frequency acoustic signals to such an extent that the signal fails to penetrate sufficiently deep into the materials inspected. Lower frequencies have a better penetration than higher frequencies, but ringing is more pronounced at lower frequencies. As was mentioned above, such ringing tends to obscure echos at lower frequencies, particularly if the echos are weak. These problems and alternative attempts to solve them are discussed in a paper by me and another "Proceedings 10th Symposium on NDE," San Antonio, Tex., Apr. 23–25, 1975, published later in that year.

Upon considering the foregoing, it must be borne in mind that as long as piezoelectric transducers are to be used, the very high acoustic impedance mismatch with a porous or fibrous material is an inevitable constraint. Different piezoelectric materials may be discovered in the future but, broadly speaking, it cannot be expected that one will find always the suitable piezoelectric transducer material for each kind of material to be inspected. Additionally, the dependency of the penetration depth of ultrasonic vibrations on frequency is an inherent property. Thus, the detection of deep penetration echo signals makes mandatory the use of as low an inspection frequency as possible.

Considering these conditions as outlined above, it must readily be said that the ultrasonic inspection of construction parts made of porous or fibrous materials has not yet been adequately solved, and the difficulties encountered originate with basic properties of the materials involved.

DESCRIPTION OF THE INVENTION

It is an object of the present invention to provide a new and improved type of piezoelectric transducer for the ultrasonic inspection of low impedance, for example, porous or fibrous materials.

In accordance with the present invention it is suggested to construct a transducer from a plurality of bar-like elements having dimensions which are relatively small in the plane of interfacing with the object to which they are acoustically coupled for transduction, but the elements are comparatively long in the direction extending transversely thereto so as to have a dominating, single mode for vibration in that length direction which mode is at least substantially the same for all transducer elements of the plurality. The small end faces of the elements are arranged in an array, preferably of regular spacing, whereby at least some of these transducer elements are driven electrically to operate mechanically in parallel or at least in a definite phase relation. The elements are mechanically interconnected by at least one thin, flexible sheet which does not couple them together mechanically in the sense that vibrations could be transmitted from one element to the others. Each transducer element is additionally provided with a damping cover or pad on its side or sides other than the end faces. These damping elements vibrate with the elements and dissipate mechanical energy. Generally speaking, damping of the longitudinal mode in this fashion suffices, the damping elements do not have to be effective, e.g., for any transverse mode. The mechanical damping is augmented by electrical damping in a manner known, per se, for individual transducers in that an inductance and a damping resistor are connected electrically across the transducers. The inductor resonates with the clamped capacitance of the transducer at the resonant mode frequency of the transducer elements so that a significant amount of driving energy is dissipated in the damping resistor.

While a simple square shaped array of a plurality of elements was found to readily suffice for regular inspection, one could use circular, hexagonal or other types of arrays. Also, the transducer elements may have prism or cylindrical configurations. Essential for the invention is that a relatively large transducing aperture is more or less covered by spaced apart elements whose end faces have small dimensions in the plane of that aperture, but the elements are relatively long in the direction transversely to that plane so that only the mode as produced by each of the elements in that direction dominates by far as far as amplitude is concerned, and any other mode is small and quite remote in the frequency spectrum. Furthermore, it was found sufficient to drive all the transducers in parallel in the strictest sense, but by introducing phase shifts and/or different drive signal amplitudes one may provide for focusing or shaping or steering of the resulting ultrasonic beam. Also, some of the transducer elements may be used for transmission only, others may exclusively receive. Still alternatively, not all transducer elements may transmit and receive, some may have these dual functions, while others have only one such function.

DESCRIPTION OF THE DRAWINGS

While the specification concludes with claims particularly pointing out and distinctly claiming the subject matter which is regarded as the invention, it is believed that the invention, the objects and features of the invention and further objects, features and advantages thereof will be better understood from the following description taken in connection with the accompanying drawings in which:

FIG. 1 is a perspective view partially in exploded form, of a transducer array in accordance with the preferred embodiment of the present invention;

FIG. 2 is a cross-section as per lines 2—2 of a portion of FIG. 1 on an enlarged scale;

FIG. 3 is a circuit and block diagram of a transducer system which includes a transducer as shown in FIGS. 1 and 2;

FIG. 4 is the equivalent circuit diagram of a transducer with supplemental damping circuitry;

FIG. 5 is a plot of impedance vs. frequency of a single element transducer with the same aperture as the transducer shown in FIG. 1;

FIG. 6 is an impedance vs. frequency plot of a transducer of the type shown in FIG. 1;

FIG. 7 is a simplified perspective view of a modified transducer still constructed in accordance with the invention; and FIG. 8 is a top view of a still further embodiment of the present invention.

Proceeding now to the detailed description of the drawing, the figures show a new transducer 10 being composed of 25 individual bars 11 made of a piezoelectric material such as lead-zirconate-titanate, or PZT for short. Each bar shaped prism has a square shaped cross-section but is considerably longer than wide and thick. By way of example, each bar is 0.28 cm by 0.28 cm in cross-section and has a length of about 1.42 cm (or 0.11 inches by 0.11 inches by 0.6 inches).

Each bar carries at its square shaped end face a layer of silver 12 and 13, and each of these layers is less than 1 mil thick. These layers serve as electrodes for exciting the bar in the longitudinal mode or for sensing voltage differences across the bar in case the bar is caused to vibrate from the outside. This way a plurality of, altogether, 25 individual or elemental transducer elements is provided. The sides of each bar 11 are covered, at least in parts, by thin slabs 17 of rubber, for example, for purposes of damping to be described and discussed more fully below.

These bars 11 each constitute an elemental transducer or transducer element; they are arranged in an array so that their respective end faces are co-planar. The bars are spaced so that the distance *a* from center axis to center axis along the rows and columns of the array is the same throughout. That arrangement is chosen so that the distance *a*, being also the center to center distance of adjacent bar end faces, approximates a wave length of the operating transducer signal in the medium to which the transducer is coupled for inspection. Presently it is assumed that the transducer is to be used for inspecting a porous part made of fibrous silica ceramic. Therefore the distance is a little under half a cm (about 2/5 of a cm) for an inspection and operation frequency of about 100 kiloherz. The length of each transducer bar is of course equal to half a wave length of the longitudinal resonant mode frequency of the bar.

The bars 11 are bonded to thin, flexible steel sheets having a thickness of about 1 mil to insure proper positioning of the bars in the array while interconnecting the electrodes of corresponding bar end faces electrically. These sheets 14 and 15 can, therefore, be considered to be two common electrodes or feed or input-output electrodes for all of the elemental transducers. Common electrical driving signals are applied to the sheets when the transducers are to be operated as transmitter, and the sheets serve as pick-up electrodes for all elemental transducers when functioning as receivers.

The sheets 14 and 15 are specifically bonded to the electrodes by means of a silver paste or a conductive epoxy. The entire assembly of bars and sheets is potted in rubber 16 whereby, however, the outer surface of one of the sheets, for example sheet 14, remains exposed and thereby defines the transducing aperture; the boundary 16' delineates that aperture. The physical interconnection of the elemental transducers as provided by sheets 14 and 15, together with the potting, establishes the transducer array as a structural and operational unit in which, however, 25 points or small areas are provided in an array for purposes of electromechanical transducing. The exposed sheet 14 with 25 transducer bars in its back synthesizes a relatively large aperture, which in this case is about 2.2 by 2.2 cm.

The transducer array, as described, has in fact only a single dominating mode of vibration which is established by the length or longitudinal mode of each of the transducer bars. Due to the fact that each bar is considerably longer than wide and thick, hardly any other mode exists, and the bars each resonate at practically that one frequency only. Moreover, the interconnection of the bars does not couple them together acoustically so that the system as a whole does not have any transverse or radial mode (see FIG. 6).

In operation, the aperture—window (16') of the transducer 10 is juxtaposed to a surface of an object A for interfacing therewith. As outlined above, the acoustic impedance of the individual transducer elements and bars is much higher than the acoustic impedance of some of the materials to be inspected so that little energy is coupled out of the transducer into object A if the transducer operates as a transmitter; most of the energy remains in the transducer elements and causes them to ring. Ringing is suppressed in a two-fold approach and by combining mechanical and electrical damping.

Mechanical damping is obtained by the slabs 17 made, for example, of neoprene rubber. These slabs are bonded to each side of the elemental transducers. The rubber vibrates with the transducer bar and introduces considerable losses of energy. However, the attenuation is not so strong that the sensitivity of the transducer is too severely reduced. Since each bar has substantially only one mode the damping needs to be effective for that one mode only. The rubber slabs have about the same length dimension as the bars have themselves so that they are in fact optimized as to the specific damping requirements for this case.

The mechanical damping thus provided does not, however, entirely suppress the ringing. For this reason electrical damping is introduced in addition. FIG. 3 shows schematically the transducer circuit. Reference 20 denotes an electrical signal source and generator which produces, for example, on demand a brief pulse with steep leading and trailing edges or it may produce a burst of HF signal having a frequency which is about equal to the longitudinal mode frequency of the transducer bars.

A control circuit 21 controls a switch 22, being actually composed of electronic gates, which connects the transducer 10 either to the signal source 20 or to a receiver circuit 23 which responds to any voltage signal developed across each and all of the elemental transducers. Transmitter (source 20) and transducer 10 should be isolated from each other during receiving because the low impedance of a typical signal source would render the electrical damping ineffective. A switch over in the circuit from 20 to 23 occurs directly following the trailing edge of a generator pulse or burst. Reference numerals 14', 15' refer to the common electrode connection by and through the sheets 14, 15 for the electric circuit which drives and monitors the transducer.

In order to provide electrical damping of any transducer ringing following the application of a transmitter signal, an inductance 25 is electrically connected in parallel to all the transducer elements. FIG. 4 shows the equivalent circuit of the transducer elements. They can be represented electrically by a series RCL circuit 27 connected in parallel with its clamped capacitance $C_o$. The inductance 25 is chosen to resonate with all the clamped capacitances of the transducer at the operating frequency. The energy that is drawn from the transducers is readily dissipated in a resistor 26 being connected in parallel to inductance or coil 25. It was found that this circuit achieves damping of any residual ringing in the transducer so that ring-down time becomes very short. This in turn means that ringing has sufficiently decayed before any echo arrives at the transducer.

The square shaped transducer array of 5 by 5 individual transducers represents a particular assembly for establishing a particular large, effective aperture using transducer elements, each of which having a comparatively small effective surface oscillating in a direction normal thereto. This arrangement was found to be convenient and practical and solves the problems outlined above. FIG. 6 shows the equivalent electrical impedance of the transducers plotted against frequency for a large range of frequencies. The longitudinal mode of each element has a frequency of about 100 kiloherz and the plotted characteristic exhibits no other modes. A single transducer having width dimensions similar to the width dimension of the array as a whole, has many other modes in that range. FIG. 5 shows by way of example such a characteristic of a cylindrical disc covering the same aperture area. The figure shows many modes of which the longitudinal is but one, and not even the strongest one. For further details on such a transducer see the paper referred to above in the chapter on the background of the invention.

The significance of FIG. 6 when compared with FIG. 5 is to be seen further in the fact that both of them were generated by devices which did not have electrical damping. Thus, the unwanted mode suppression is solely the result of the array configuration wherein the individual transducer elements are however, mechanically damped by the side slabs 17.

In summary, it can readily be seen that each transducer element and the transducer as a whole is sufficiently damped so that ringing decays within a few cycles following a sharp and definite pulse when applied to the transducer so that even a short range echo from a rather small flaw or the like becomes readily detectible. Since there are no noticeable parasitic modes, electrical damping does not have to be excessive so that broad banded echos are still readily detected, which, in turn, means that the penetration depth of the transducer is as satisfactory as can be expected for porous material.

As shown somewhat schematically in FIG. 7, the electrodes or the transducer elements facing the transducing aperture could be connected to separate steel strips 14*a*, 14*b*, 14*c*, etc. For example, the end faces of the transducer elements pertaining to the same row are connected to such a common steel strip. The several strips 14*a*, 14*b*, 14*c*, etc., receive electrically driven signals separately and with a predetermined phase difference $\phi$, $2\phi$, etc. This way, the emitted wave front is tilted and steered in a direction which is not normal to the transducer object interface. The phase shift $\phi$ between the several signals determines the steering or tilt angle. For practicing the invention in this manner, the transmitter circuit may provide a predetermined signal S, and the phase shifted signals $S + \phi$, $S + 2\phi$, etc., are produced through suitable delays.

The 5 by 5 array of square shaped transducer prisms is only one mode of practicing the inventions though presently deemed the preferred mode. However, each transducer element could have still smaller cross sections and a larger number of elements may be needed for covering the same aperture. It was found that there is no need for such an increase, particularly, then, there is no need for increasing the length to cross section ratio. The chosen dimensions are sufficient to avoid any interfering parasitic modes. On the other hand, a different number of bars in the array should be used if a different aperture width is desired.

The rectangular and square shaped kind of array was found well suited for a transducer when used for inspecting material by the standard pulse echo method. In cases, however, it may be desirable to use a circular array as shown in FIG. 8. Moreover, each bar is of cylindrical construciton, but these bars 31 are of similar length. Each round bar has its cylindrical surface covered with a rubber hose or several of them being shrunk onto the piezoelectric material and serve as damping medium.

The transducers may be grouped in that the central group is connected to one electrode 33 and connecting plate, and the outer ring of transducers is connected to a corresponding annulus 34. The opposite ends of the transducer elements may be connected by a common sheet. Also, the assembly may be potted as described above. Such an arrangement permits separate control of the central and of the outer transducers as regards to excitation as indicated by the separate blocks in FIG. 7, and labelled source 1 and source 2 respectively.

Particularly, upon choosing different amplitudes and/or phase for the energizing signals for inner and outer frequencies the resulting wave front being launched into the interior of the object under investigation, is shaped and/or focused therewith.

The invention is not limited to the embodiments described above but all changes and modifications thereof not constituting departures from the spirit and scope of the invention are intended to be included.

I claim:

1. A transducer for producing an ultrasonic inspection signal and for receiving an echo of such signal in a solid object having low acoustic impedance, comprising:

an array of individual piezoelectric transducer elements each having a first length dimension and two end faces extending transversely to the length dimension, one end face of each element being positioned in a common surface, said end faces each having linear dimensions which are small in relation to said first dimension of the respective element so that each element has a dominating mode in the direction of the length dimension, said elements being spaced apart and positioned parallel to each other to form said array;

a thin, flexible sheet bound to said one end face of each of said transducer elements in said common surface for providing mechanical interconnection of said transducer elements within coupling them together for any transmission of oscillatory energy from one of the elements to any of the other ones, said sheet providing a transducer aperature for placing directly against the solid object; and means for mechanically damping each of said transducer elements, said mechanical damping means being positioned between said transducer elements but not across said transducer aperature, whereby a low frequency signal can be launched deeply into a solid object having low acoustic impedance and ringing of the transducer dampened so that a returning signal can be detected.

* * * * *